(12) United States Patent
Christman et al.

(10) Patent No.: US 8,575,755 B1
(45) Date of Patent: Nov. 5, 2013

(54) SEMICONDUCTOR DEVICE HAVING MODE OF OPERATION DEFINED BY INNER BUMP ASSEMBLY CONNECTION

(75) Inventors: Kymberly Tennille Christman, San Jose, CA (US); Roderick Brian Hogan, San Francisco, CA (US); Anand K Chamakura, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 269 days.

(21) Appl. No.: 12/907,393

(22) Filed: Oct. 19, 2010

(51) Int. Cl.
*H01L 23/48* (2006.01)
*H01L 23/52* (2006.01)
*H01L 29/40* (2006.01)

(52) U.S. Cl.
USPC ........... 257/773; 257/737; 257/778; 257/780; 257/E23.021; 257/E23.069

(58) Field of Classification Search
USPC .......... 257/737, 738, 773, 778, 780, E23.021, 257/E23.069
See application file for complete search history.

(56) References Cited

U.S. PATENT DOCUMENTS

| | | | |
|---|---|---|---|
| 6,184,577 B1* | 2/2001 | Takemura et al. | 257/701 |
| 6,344,695 B1* | 2/2002 | Murayama | 257/781 |
| 2003/0137057 A1* | 7/2003 | Honda | 257/778 |
| 2005/0173796 A1* | 8/2005 | Pflughaupt et al. | 257/737 |
| 2006/0076691 A1* | 4/2006 | Prengel et al. | 257/778 |

\* cited by examiner

*Primary Examiner* — Michelle Mandala
(74) *Attorney, Agent, or Firm* — Advent, LLP

(57) ABSTRACT

Semiconductor devices are described that are configured to have a state of operation defined by a connection between at least one inner bump assembly and a selected outer bump assembly. In an implementation, the semiconductor device, which may be a wafer-level (chip-scale) package semiconductor device, includes an integrated circuit chip, a plurality of outer bump assemblies disposed on the chip, and one or more inner bump assemblies disposed on the chip so that the inner bump assemblies are at least partially surrounded by the outer bump assemblies. At least one of the inner bump assemblies is configured to be connected to a selected outer bump assembly to cause the integrated circuit chip to have a desired state of operation.

14 Claims, 5 Drawing Sheets

SEMICONDUCTOR DEVICE HAVING MODE OF OPERATION DEFINED BY INNER BUMP ASSEMBLY CONNECTION

BACKGROUND

Semiconductor device packaging technologies have evolved to develop smaller, cheaper, and more environmentally-friendly packages. Wafer-level packaging is a chip-scale packaging technology that encompasses a variety of techniques whereby integrated circuit chips are packaged at wafer level, prior to singulation. Wafer level packaging extends the wafer fabrication processes to include device interconnection and device protection processes. Consequently, wafer level packaging streamlines the manufacturing process by allowing for the integration of wafer fabrication, packaging, testing, and burn-in processes at the wafer level.

Wafer-level package devices are mounted to flexible or printed circuit boards, which furnish mechanical support to the devices and electrical connectivity between the devices and various electronic components. Generally, traces formed on the printed circuit board provide conduits between the bump assemblies of the mounted wafer-level package devices and other electronic components.

SUMMARY

Semiconductor devices are described that are configured to have a state of operation defined by a connection between at least one inner bump assembly and a selected outer bump assembly. The inner bump assembly and outer bump assembly connection configuration may thus be used to define chip functionality without external circuit board routing. In an implementation, the semiconductor device, which may be a wafer-level (chip-scale) package semiconductor device, includes an integrated circuit chip, a plurality of outer bump assemblies disposed on the chip, and one or more inner bump assemblies disposed on the chip so that the inner bump assemblies are at least partially surrounded by the outer bump assemblies. At least one of the inner bump assemblies is configured to be connected to a selected outer bump assembly to cause the integrated circuit chip to have a desired state of operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
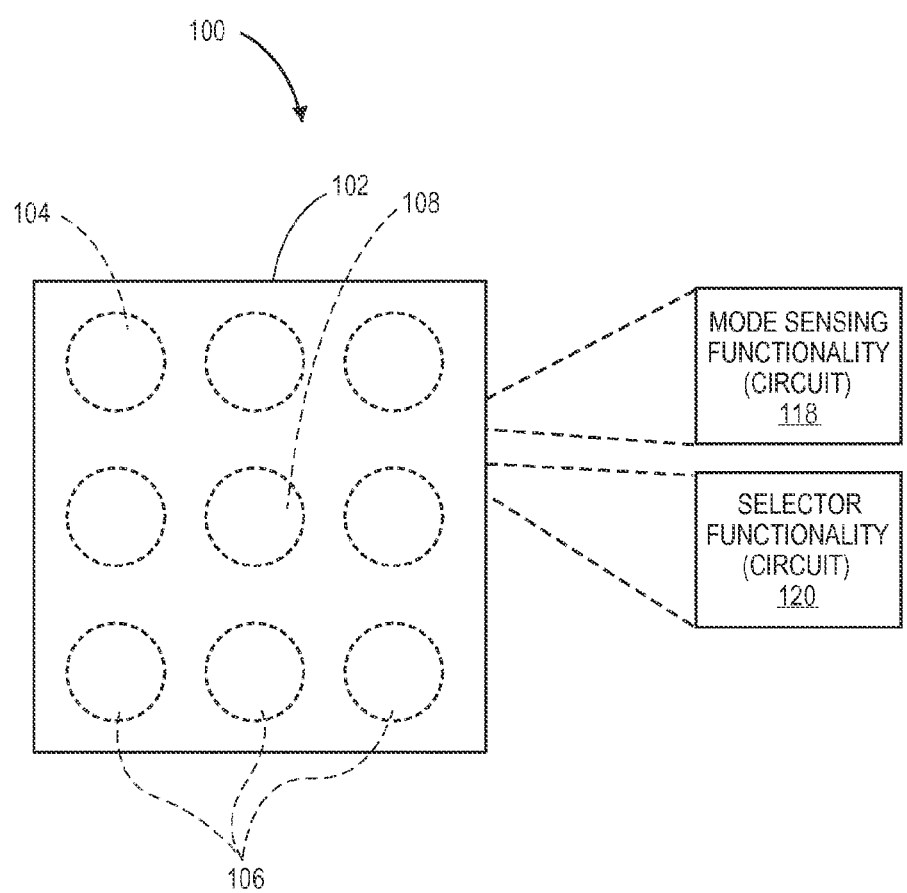
FIG. 1 is a diagrammatic top plan view of a wafer-level package semiconductor device in an example environment, wherein a connection between at least one inner bump assembly and at least one selected outer bump assembly of the device defines a state of operation of the integrated circuit chip of the device.

Wafer-level package (WLP) or chip-scale package (CSP) semiconductor devices often employ arrays of fine-pitch bump assemblies that furnish mechanical support to the devices and/or provide electrical connectivity between the integrated circuit chips of the devices and a circuit board such as a printed circuit board (PCB). In fine-pitch WLP PCB designs, routing density for the WLP device may become extreme. Consequently, staggered via configurations become more difficult to use due to limitations imposed by design rule restrictions, and so forth. In such instances, a stacked via configuration may be employed. Stacked via configurations employ multiple vias that are stacked one on top of the other to achieve the highest possible routing density.

Via (e.g., standard via, micro-via, etc.) configurations require the use of multi-layer PCBs, which are costly to manufacture. High-density interconnect (HDI) PCBs are becoming more prevalent over non-HDI PCBs due to device miniaturization and other device advances. In many applications, the use of stacked-vias in WLP PCB designs is avoided due to the extra cost associated with stacked vias. One approach to avoid the use of micro-via configurations is to leave the interior bump(s) of the WLP device unconnected. However, this approach may require the use of expensive metal mask operations during assembly. Another approach is to increase the WLP pitch size. However, this solution can be undesirable since it increases both cost and size of the solution.

Accordingly, WLP devices are described that comprise an integrated circuit chip configured to have a state of operation defined by a connection between an inner bump assembly and a selected outer bump assembly of the device. The connection may be furnished via a trace on the PCB on which the WLP device is mounted. Mode sensing functionality (e.g., a mode sensing circuit implemented in the integrated circuit chip) may be provided to sense a mode (e.g., voltage, current, duty-cycle, resistance, inductance, capacitance, frequency, etc.) associated with the inner bump connection to define the state of operation of the integrated circuit chip of the device. In this manner, the inner bump assembly and outer bump assembly connection configuration may be used to define chip functionality (e.g., amplifier gain, Inter-Integrated Circuit (I2C) address, etc.) without external circuit board (PCB) routing (e.g., stacked vias). The WLP devices thus ease PCB layout complexity, especially for devices having small pitch sizes and reduce PCB costs. Pitch sizes may range from approximately 0.3 mm to approximately 0.5 mm; however, it contemplated that pitch sizes will continue to decrease as device miniaturization occurs. WLP devices in accordance with the present disclosure may be employed in a variety of applications including, but not limited to: audio system applications, system on chip (SOC) applications, dynamic random access memory (DRAM) applications, and so forth.

Example Implementations

Figure 2:
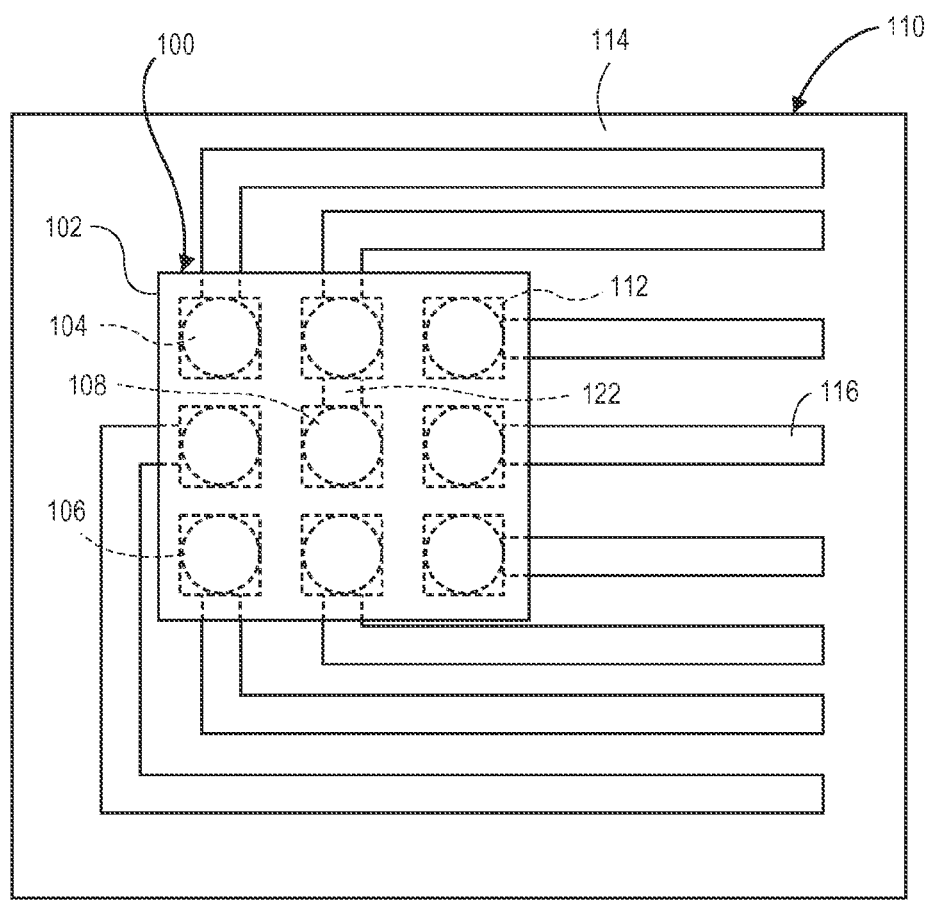
FIG. 2 is diagrammatic top plan view illustrating the wafer-level package semiconductor device shown in FIG. 1 mounted to a circuit board, depicting an example inner bump connection configuration between an inner bump assembly and an outer bump assembly.

FIGS. 1 and 2 illustrate a WLP device 100 in accordance with an example implementation of the present disclosure. As shown, the WLP device 100 includes an integrated circuit chip 102 having an array of bump assemblies 104 provided on a surface of the chip 102. The array of bump assemblies 104 includes a plurality of outer bump assemblies 106 and at least one inner bump assembly 108 that is at least partially surrounded by the bump assemblies 104 of the plurality of outer bump assemblies 106. As shown in FIG. 2, the WLP device 100 may be mounted to a printed circuit board (PCB) 110 of an electronic device using a suitable connection technique.

In FIGS. 1 and 2, the illustrated WLP device 100 includes an array of nine (9) bump assemblies 104 arranged in three columns of three rows each (e.g., a 3×3 array of bump assemblies 104). However, it is contemplated that the techniques described herein may be employed by devices 100 having larger arrays of bump assemblies 104. In such instances, the bump assemblies 104 may often be configured in a×b arrays, where "a" is the number of bump assemblies 104 per row and "b" is the number of bump assemblies 104 per column. Thus, in implementations, WLP devices 100 employing the present techniques may be configured with a 3×4 array of bump assemblies, a 3×5 array of bump assemblies, a 4×4 array of bump assemblies 104, a 4×5 array of bump assemblies, a 4×6 array of bump assemblies, a 5×5 array of bump assemblies 104, a 5×6 array of bump assemblies, a 6×6 array of bump assemblies 104, and so forth. In such implementations, the distance from the outer bump assemblies 106 to a center of the device 100 (e.g. to the center of the integrated circuit chip 102) may be less than the distance from other bump assemblies 106 to the center of the device 100. Thus, it is contemplated that one or more of the outer bump assemblies 106 may be an "interior" bump assembly 104 that is at least partially surrounded by other bump assemblies 104 even though the outer bump assemblies 106 may be considered "outer" to at least one inner bump assembly 108. For example, in a WLP device having a 6×6 array of bump assemblies 104, the outer bump assemblies 106 may be considered "outer" compared to one or more of the inner bump assemblies 108, but may also be considered "inner" compared to other bump assemblies 104 that are located further from the center of the WLP device 100.

The integrated circuit chip 102 is configured to have one or more states of operation (e.g., a switching frequency, an amplifier gain factor, a filter corner frequency, etc.) defined by the connection between an inner bump assembly 108 and a selected one of the plurality of outer bump assemblies 106 (hereinafter the "inner bump connection configuration"). The integrated circuit chip 102 may be configured in a variety of ways. In implementations, the integrated circuit chip 102 may comprise a semiconductor substrate having one or more integrated circuits formed in the substrate. A redistribution structure may be formed on the surface of the substrate over the integrated circuits. The redistribution structure redistributes peripheral bonding pads of the integrated circuits to one or more area arrays of bonding pads that are deployed over the surface of the integrated circuit chip 102. The bonding pads provide electrical contacts through which the integrated circuits may be interconnected to external components such as the circuit board 110. The configuration of the redistribution structure and/or the number and configuration of bonding pads provided by the redistribution structure may vary depending on the complexity and configuration of the integrated circuit, the size and shape of the integrated circuit chip 102, and so forth. In one or more implementations, the WLP device 102 may employ multiple integrated circuit chips 102 in a stacked die configuration.

The bump assemblies 104 (e.g., outer bump assemblies 106, inner bump assembly 108) furnish mechanical and/or electrical interconnection between the integrated circuit chip 102 and corresponding pads 112 formed on the surface 114 of the circuit board 110. Connections 116 may be formed in the surface of the circuit board 110, and may interconnect the pads 112 with other electronic components on the circuit board 110. In embodiments, the bump assemblies 104 may comprise a solder bump formed on the bonding pads of the redistribution structure of the integrated circuit chip 102 using a redistribution and bump technology. Each bump assembly 104 may be configured to provide a specific mechanical and/or electrical interconnection interface. For example, a first outer bump assembly 106 may be configured to provide an interface between a high voltage rail (VCC) input source and the integrated circuit chip 102, while a second outer bump assembly 106 may be configured to provide an interface between a ground (GND) source and the integrated circuit chip 102. A third bump assembly 106 may be configured to provide an interface between an audio integrated circuit 102 output pin (e.g., OUTP, OUTN) and the corresponding pad 110.

As illustrated in FIG. 1, the integrated circuit chip 102 includes mode sensing functionality 118 configured to sense a mode of the inner bump connection. Example modes that may be sensed include, but are not limited to: a resistance measurement, an inductance measurement, a capacitance measurement, a frequency measurement, a voltage measurement (i.e., positive voltage measurement, negative voltage measurement, float measurement), a current measurement, an impedance measurement, a rise-time measurement, a fall-time measurement, a duty-cycle measurement, a jitter measurement, or a phase measurement. Mode sensing functionality 118 may be implemented in a variety of ways. For example, mode sensing functionality 118 may be implemented as a mode sensing circuit provided by the integrated circuit chip 102. In an implementation, the mode sensing circuit may be a current sensing circuit configured to sense current in the inner bump connection. In another implementation, the mode sensing circuit may be a voltage sensing circuit configured to sense voltage in the inner bump connection. In yet another implementation, the mode sensing circuit may be configured to sense a combination of voltage and current. Other examples are possible.

The wafer-level package device 100 also includes selector functionality 120 configured to select an adjustable parameter based upon the mode sensed by sensor functionality 118. The adjustable parameter is utilized to define a state of operation (e.g., switching frequency, amplifier gain factor, filter corner frequency, etc.) of the integrated circuit chip 102. Selector functionality 120 may be configured in a variety of ways. For example, selector functionality 120 may be implemented as a selector circuit provided by the integrated circuit chip 102. In various implementations, the adjustable parameter may include, but is not limited to: an adjustable resistance, an adjustable capacitance, an adjustable inductance, an adjustable voltage, an adjustable current, an adjustable counter value, an adjustable multiplexor setting, combinations of these parameters, and so forth.

As illustrated in FIG. 2, at least one inner bump assembly 108 of the WLP device 100 is configured to be connected to a selected outer bump assembly 106 via a trace 122 formed in the surface of the circuit board 110. In this manner, the state of operation of the integrated circuit chip 102 may be defined by selecting the pattern of the trace 122 to furnish a connection between the inner bump assembly 108 and a selected outer bump assembly 106. Thus, depending on the number of options provided for the state of operation of the integrated circuit chip 102, traces 122 may be patterned on the circuit board 110 to alternately connect the inner bump assembly 108 to a first outer bump assembly 106 to cause the integrated circuit chip 102 to have a first state of operation, to a second outer bump assembly 106 to cause the integrated circuit chip 102 to have a second state of operation, to a third outer bump assembly 106 to cause the integrated circuit chip 102 to have a third state of operation, to a fourth outer bump assembly 106 to cause the integrated circuit chip to have a fourth state of operation, to a fifth outer bump assembly 106 to cause the integrated circuit chip to have a fifth state of operation, and so on. When the integrated circuit chip 102 is initialized and in a powered on state, mode sensing functionality 118 provided by the chip 102 senses a mode based upon the bump assembly connection provided by the trace 122. Selector functionality 120 provided by the integrated circuit chip 102 then selects an adjustable parameter to define the state of operation of the integrated circuit chip 102.

In the example implementation of FIGS. 1 and 2, the WLP device 100 is illustrated as a chip-scale semiconductor device fabricated using wafer-level packaging (WLP) or chip scale packaging (CSP) manufacturing techniques wherein the integrated circuit chip 102 is packaged at wafer level, prior to segmentation of the chip from the wafer. However, it is contemplated that the techniques described herein may be implemented in chip-scale semiconductor devices fabricated using other manufacturing techniques.

Example WLP Device Configurations

Figure 3:
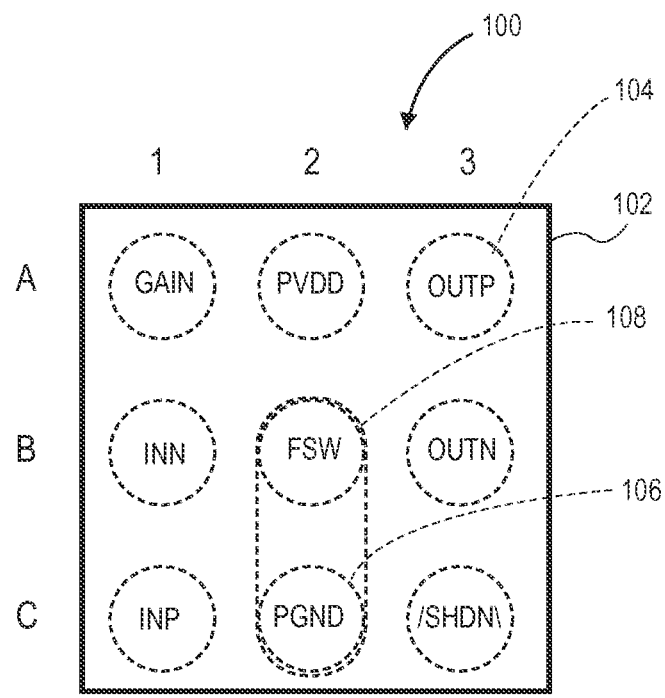
FIG. 3 is diagrammatic top plan view of a wafer-level package semiconductor device in an example implementation, wherein the state of operation of the device defined by the inner bump connection configuration comprises a switching frequency selection.
Figure 4:
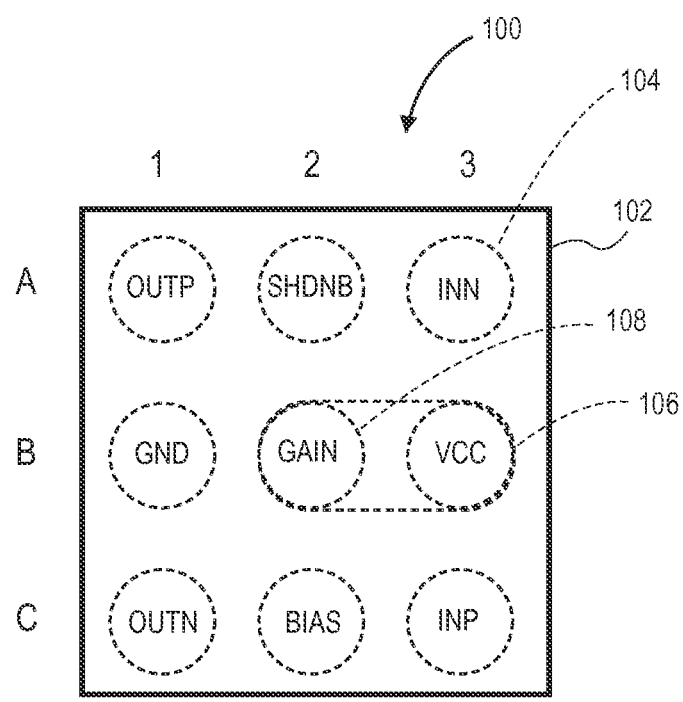
FIG. 4 is diagrammatic top plan view of a wafer-level package semiconductor device in an example implementation, wherein the state of operation of the device defined by the inner bump connection configuration comprises an amplifier gain selection.
Figure 5:
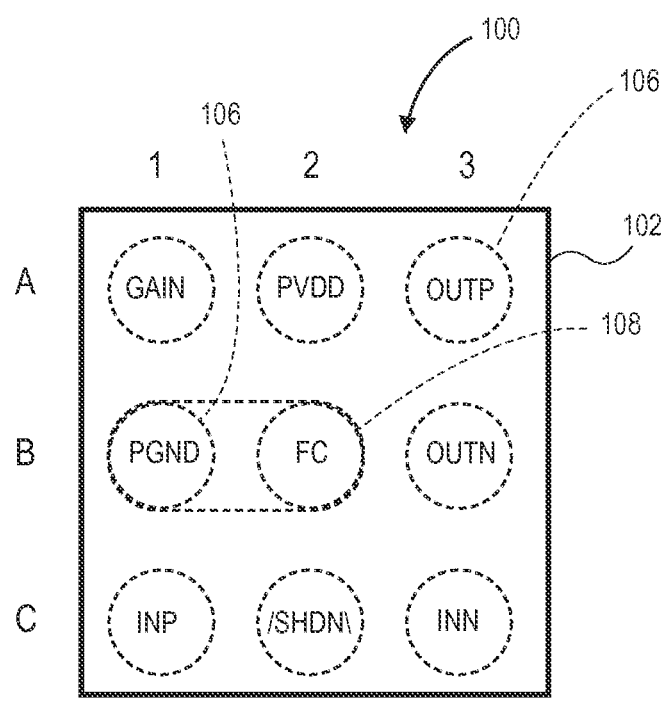
FIG. 5 is diagrammatic top plan view of a wafer-level package semiconductor device in an example implementation, wherein the state of operation of the device defined by the inner bump connection configuration comprises a filter corner frequency selection.

Example implementations of the WLP device 100 in accordance with the present disclosure are illustrated in FIGS. 3 through 5. In these implementations, the illustrated bump assemblies 104 are marked with designations of the corresponding interface that the specified bump assembly 104 provides to the integrated circuit chip 102 and/or corresponding pad 112 of the circuit board 110 (shown in FIG. 2). For example, an outer bump assembly 106 is designated "OUTP" and is configured to provide an interface between an output pin of the integrated circuit chip 102 and a corresponding pad 112 of the circuit board 110. Similarly, an outer bump assembly 106 designated "INP" is configured to provide an interface between an input pin of the integrated circuit chip 102 and a corresponding pad 112 of the circuit board 110.

While example implementations are described below, it is understood that multiple bump assembly 104 connection configurations are available. For instance, in a 6×6 array of bump assemblies 104, many combinations of outer bump assemblies 106 and inner bump assemblies 108 may be connected in different configurations to provide a number of predefined states of operation.

Example 1

Three (3) Option Configuration

FIG. 3 illustrates an example WLP device 100 in an example implementation, wherein the device 100 is configured to have a state of operation comprising a switching frequency selection. The device 100 includes an integrated circuit chip 102 configured with three (3) switching frequency option configurations as illustrated in Table 1. The specific switching frequency of the integrated chip 102 is defined within the integrated circuit chip 102 based upon a connection between the inner bump assembly 108, which is designated "FSW," and a selected outer bump assembly 106.

TABLE 1

| Switching Frequency Selection | |
|---|---|
| FSW BUMP | Switching Frequency [MHz] |
| Connect to PVDD | 1.2 |
| Connect to PGND | 1.0 |
| Unconnected | 0.8 |

For example, a trace 122 of the circuit board 110 may connect the "FSW" inner bump assembly 108 to the "PVDD" outer bump assembly 106. The mode sensing functionality 118 detects a mode associated with the "PVDD" trace 122 (e.g., voltage level, resistance, etc.), and the selector functionality 120 selects an adjustable parameter (e.g., resistance value, impedance value, etc.) to define a switching frequency (e.g., 1.2 megahertz [MHz]) associated with the "PVDD" outer bump assembly 106 to "FSW" inner bump assembly 108 connection within the integrated circuit chip 102. In another example, a trace 122 of the circuit board 110 may connect the "FSW" inner bump assembly 108 to the "PGND" outer bump assembly 106. The mode sensing functionality 118 detects a mode associated with the "PGND" trace 122, and the selector functionality 120 selects an adjustable parameter to define a switching frequency (e.g., 1 MHz) associated with the "PGND" outer bump assembly 106 to "FSW" inner bump assembly 108 connection within the integrated circuit chip 102. In yet another example, the "FSW" inner bump assembly 108 may be left floating or unconnected. The mode sensing functionality 118 detects a mode associated with the floating configuration (e.g., resistance, etc.), and the selector functionality 120 selects an adjustable parameter to define a switching frequency (e.g., 0.8 MHz) associated with the floating configuration within the integrated circuit chip 102.

Example 2

Four (4) Option Configuration

FIG. 4 illustrates another example WLP device 100 in an example implementation, wherein the device 100 is configured to have a state of operation comprising an amplifier gain factor. The device 100 includes an audio integrated circuit chip 102 configured with four (4) amplifier gain factor option configurations as illustrated in Table 2. In an implementation, a specific amplifier gain factor is defined within the integrated circuit chip 102 based upon a connection between the inner bump assembly 108, which is designated "GAIN," and a selected outer bump assembly 106.

TABLE 2

Amplifier Gain Selection

| GAIN BUMP | GAIN [dB] |
|---|---|
| Connect to VCC | 0 |
| Connect to GND | 3 |
| Connect to BIAS | 6 |
| Unconnected | 9 |

For example, a trace 122 of the circuit board 110 may connect the "GAIN" inner bump assembly 108 to the "VCC" outer bump assembly 106. The mode sensing functionality 118 detects a mode associated with the "VCC" trace 122 (e.g., voltage level, resistance, etc.), and the selector functionality 120 selects an adjustable parameter (e.g., resistance value, impedance value, etc.) to define an amplifier gain factor (e.g., 0 decibels [dB]) associated with the "VCC" outer bump assembly 106 to "GAIN" inner bump assembly 108 connection within the audio integrated circuit chip 102. In another example, a trace 122 of the circuit board 110 may connect the "GAIN" inner bump assembly 108 to the "GND" outer bump assembly 106. The mode sensing functionality 118 detects a mode associated with the "GND" trace 122, and the selector functionality 120 selects an adjustable parameter to define an amplifier gain factor (e.g., 3 dB) associated with the "GND" outer bump assembly 106 to "GAIN" inner bump assembly 108 connection within the audio integrated circuit 102. In another example, a trace 122 of the circuit board 110 may connect the "GAIN" inner bump assembly 108 to the "BIAS" outer bump assembly 106. The mode sensing functionality 118 detects a mode associated with the "BIAS" trace 122, and the selector functionality 120 selects an adjustable parameter to define an amplifier gain factor (e.g., 6 dB) associated with the "BIAS" outer bump assembly 106 to "GAIN" inner bump assembly 108 connection within the audio integrated circuit chip 102. In yet another example, the "GAIN" inner bump assembly 108 may be left floating. The mode sensing functionality 118 detects a mode associated with the floating configuration (e.g., resistance, etc.), and the selector functionality 120 selects an adjustable parameter to define an amplifier gain factor (e.g., 9 dB) associated with the floating configuration within the audio integrated circuit chip 102.

Example 3

Five (5) Option Configuration

FIG. 5 illustrates yet another example WLP device 100 in an example implementation, wherein the device 100 is configured to have a state of operation comprising a negative three (3) decibel frequency ($f_{-3}$ dB) (i.e., filter cutoff frequency, filter corner frequency, etc.) selection. The device 100 includes a high-pass filter integrated circuit chip 102 configured with five (5) filter corner frequency option configurations as illustrated in Table 3. In an implementation, a specific filter corner frequency is defined within the high-pass filter integrated circuit chip 102 based upon a connection between the inner bump assembly 108, which is designated "FC," and a selected outer bump assembly 106.

TABLE 3

Filter Corner Frequency Selection

| FC BUMP | $f_{-3dB}$ [Hz] |
|---|---|
| Connect to /SHDN\, where /SHDN\ has 100 kΩ series resistor | 20 |
| Connect to OUTN | 100 |
| Connect to PGND | 200 |
| Connect to PVDD | 400 |
| Unconnected | 800 |

For example, a trace 122 of the circuit board 110 may connect the "FC" inner bump assembly 108 to the "/SHDN\" outer bump assembly 106. The mode sensing functionality 118 detects a mode associated with the "/SHDN\" trace 122 (e.g., voltage level, resistance, etc.), and the selector functionality 120 selects an adjustable parameter (e.g., resistance value, impedance value, etc.) to define or set a filter corner frequency (e.g., 20 Hz) associated with the "/SHDN\" outer bump assembly 106 to "FC" inner bump assembly 108 connection. In another example, a trace 122 of the circuit board 110 may connect the "OUTN" outer bump assembly 106 to the "FC" inner bump assembly 108. The mode sensing functionality 118 detects a mode associated with the "OUTN" trace 122, and the selector functionality 120 selects an adjustable parameter to define a filter corner frequency (e.g., 100 Hz) associated with the "OUTN" outer bump assembly 106 to "FC" inner bump assembly 108 connection. In another example, a trace 122 of the circuit board 110 may connect the "FC" inner bump assembly 108 to the "PGND" outer bump assembly 106. The mode sensing functionality 118 detects a mode associated with the "PGND" trace 122, and the selector functionality 120 selects an adjustable parameter to define a filter corner frequency (e.g., 200 Hz) associated with the "PGND" outer bump assembly 106 to "FC" inner bump assembly 108 connection. In another example, a trace 122 of the circuit board 110 may connect the "FC" inner bump assembly 108 to the "PVDD" outer bump assembly 106. The mode sensing functionality 118 detects a mode associated with the "PVDD" trace 122, and the selector functionality 120 selects an adjustable parameter to define a filter corner frequency (e.g., 400 Hz) associated with the "PVDD" outer bump assembly 106 to "FC" inner bump assembly 108 connection. In yet another example, the "FC" inner bump assembly 108 may be left floating. The mode sensing functionality 118 detects a mode associated with the floating configuration (e.g., resistance, etc.), and the selector functionality 120 selects an adjustable parameter to define a filter corner frequency (e.g., 800) associated with the floating configuration.

It is contemplated that a consumer (e.g., the manufacturer of the circuit board 110, an assembler assembling the WLP device 100 to the circuit board 110) of the WLP device 100 may pre-determine a state of operation of the integrated circuit chip 102. For example, as described in the preceding example, a consumer may decide to have a filter corner frequency associated with the "PVDD" outer bump assembly 106 to "FC" inner bump assembly 108 connection. The consumer can manufacture the circuit board 106 to include a trace connection 122 between the "PVDD" outer bump assembly 106 and "FC" inner bump assembly 108 when the integrated circuit chip 102 is mounted in the circuit board 110.

Example Procedures

Figure 6:
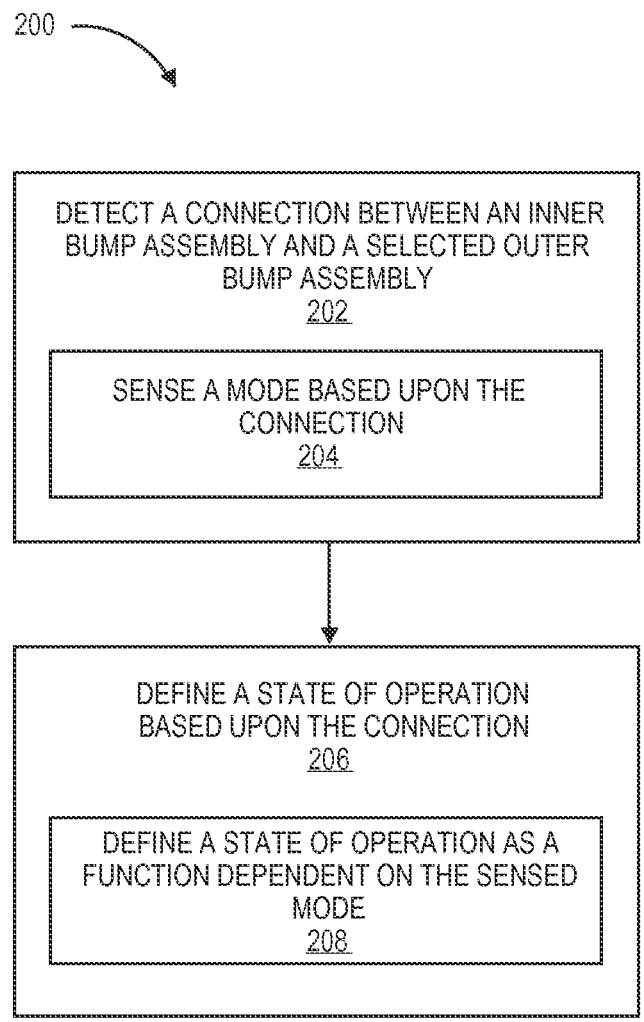
FIG. 6 is a flow diagram illustrating a process in an example implementation to define a state of operation of the integrated circuit chip of a semiconductor device based upon an inner bump connection configuration of the device.

The following discussion describes example techniques that may be implemented by the WLP device 100 to define a state of operation based upon an inner bump assembly 108 connection. FIG. 6 depicts a procedure 200 in an example implementation in which a state of operation is defined by an integrated circuit chip 102. As illustrated, a connection is detected between an inner bump assembly 108 and a selected outer bump assembly 106 (block 202). In an implementation, a mode (e.g., voltage measurement, current measurement, impedance measurement, etc.) is sensed based upon the connection (block 204). The mode may be sensed, for example, by mode sensing functionality (e.g., a mode sensing circuit) 118 implemented in the integrated circuit chip 102.

The integrated circuit chip 102 is configured to define a state of operation based upon the detected connection (block 206). For example, the integrated circuit chip 102 may define a state of operation as a function dependent on the sensed mode (block 208). The function may include, but is not limited to: a switching frequency, an amplifier gain factor, or a filter corner frequency. The function may be adjusted as a result of the adjustable parameter that is selected by selector functionality (e.g., a selector circuit) 120 implemented in the integrated circuit chip 102. In various implementations, the adjustable parameter may be an adjustable resistance, an adjustable capacitance, an adjustable inductance, an adjustable voltage, and so forth. For instance, in example implementations, the integrated circuit chip 102 may define a state of operation as a function of a switching frequency (FIG. 3 and Table 1), an amplifier gain factor (FIG. 4 and Table 2), or a cut-off frequency (FIG. 5 and Table 3). Other examples are possible.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
an integrated circuit chip;
a plurality of outer bump assemblies disposed on the integrated circuit chip;
at least one inner bump assembly disposed on the integrated circuit chip so that the at least one inner bump assembly is at least partially surrounded by the plurality of outer bump assemblies, wherein a connection between the at least one inner bump assembly and a first selected one of the plurality of outer bump assemblies defines a first state of operation for the integrated circuit and a connection between the at least one inner bump assembly and a second selected one of the plurality of outer bump assemblies defines a second state of operation for the integrated circuit, the first state of operation different from the second state of operation; and
a selector circuit configured to cause the integrated circuit chip to operate in the first state of operation when the at least one inner bump assembly is connected to the first one of the outer bump assemblies and to cause the integrated circuit chip to operate in the second state of operation when the at least one inner bump assembly is connected to the second one of the outer bump assemblies.

2. The semiconductor device as recited in claim 1, wherein the at least one inner bump assembly is configured to be connected to the selected one of the plurality of outer bump assemblies by a trace of a circuit board to which the semiconductor device is mounted.

3. The semiconductor device as recited in claim 1, wherein the at least one inner bump assembly is configured to alternately be connected to a third selected one of the plurality of outer bump assemblies to cause the integrated circuit chip to have a third state of operation, the third state of operation different from the first state of operation and the second state of operation.

4. The semiconductor device as recited in claim 1, wherein the integrated circuit chip is configured to amplify a signal at a first gain factor in the first state of operation and is configured to amplify the signal at a second gain factor in the second state of operation, the first gain factor different from the second gain factor.

5. The semiconductor device as recited in claim 1, wherein the first state of operation sets a first corner frequency and the second state of operation sets a second corner frequency, the first corner frequency different from the second corner frequency.

6. The semiconductor device as recited in claim 1, wherein the integrated circuit chip is configured to sense a mode based upon the connection between the at least one inner bump assembly and the selected one of the plurality of outer bump assemblies.

7. The semiconductor device as recited in claim 6, wherein the integrated circuit chip comprises a mode sensing circuit configured to sense the mode.

8. The semiconductor device as recited in claim 7, wherein the mode comprises at least one of a resistance measurement, an inductance measurement, a capacitance measurement, a frequency measurement, a voltage measurement, a current measurement, an impedance measurement, a rise-time measurement, a fall-time measurement, a duty-cycle measurement, a jitter measurement, or a phase measurement.

9. An electronic device comprising:
a circuit board; and
a semiconductor device mounted to the circuit board, the semiconductor device including an integrated circuit chip, a plurality of outer bump assemblies disposed on the integrated circuit chip, at least one inner bump assembly disposed on the integrated circuit chip so that the at least one inner bump assembly is at least partially surrounded by the plurality of outer bump assemblies, a selector circuit configured to cause the integrated circuit chip to operate in a first state of operation when the at least one inner bump assembly is connected to the first one of the outer bump assemblies and to cause the integrated circuit chip to operate in a second state of operation when the at least one inner bump assembly is connected to the second one of the outer bump assemblies, wherein a connection between the at least one inner bump assembly and a first selected one of the plurality of outer bump assemblies defines the first state of operation for the integrated circuit and a connection between the at least one inner bump assembly and a second selected one of the plurality of outer bump assemblies defines the second state of operation for the integrated circuit, the first state of operation different from the second state of operation.

10. The electronic device as recited in claim 9, wherein the circuit board comprises a trace formed on a surface of the circuit board, the trace configured to connect the at least one inner bump assembly to the selected one of the plurality of outer bump assemblies.

11. The electronic device as recited in claim 9, wherein the at least one inner bump assembly is configured to alternately be connected to a third selected one of the plurality of outer bump assemblies to cause the integrated circuit chip to have a third state of operation, the third state of operation different from the first state of operation and the second state of operation.

12. The electronic device as recited in claim 9, wherein the integrated circuit chip is configured to amplify a signal at a first gain factor in the first state of operation and is configured to amplify the signal at a second gain factor in the second state of operation, the first gain factor different from the second gain factor.

13. The electronic device as recited in claim 9, wherein the first state of operation sets a first corner frequency and the second state of operation sets a second corner frequency, the first corner frequency different from the second corner frequency.

14. The electronic device as recited in claim 9, wherein the integrated circuit chip is configured to sense a mode based upon the connection between the at least one inner bump assembly and the selected one of the plurality of outer bump assemblies.

\* \* \* \* \*